United States Patent
Hackler, Sr.

(10) Patent No.: US 10,438,895 B1
(45) Date of Patent: Oct. 8, 2019

(54) FLEXIBLE MICRO-MODULE

(71) Applicant: Douglas R. Hackler, Sr., Boise, ID (US)

(72) Inventor: Douglas R. Hackler, Sr., Boise, ID (US)

(73) Assignee: American Semiconductor, Inc., Boise, ID (US)

( * ) Notice: Subject to any disclaimer, the term of this patent is extended or adjusted under 35 U.S.C. 154(b) by 0 days.

(21) Appl. No.: 16/003,389

(22) Filed: Jun. 8, 2018

(51) Int. Cl.
| | |
|---|---|
| *H01L 23/538* | (2006.01) |
| *H01L 23/00* | (2006.01) |
| *H01L 23/498* | (2006.01) |
| *H01L 23/66* | (2006.01) |
| *H01L 23/13* | (2006.01) |

(52) U.S. Cl.
CPC .......... *H01L 23/5388* (2013.01); *H01L 23/13* (2013.01); *H01L 23/49883* (2013.01); *H01L 23/5384* (2013.01); *H01L 23/5386* (2013.01); *H01L 23/5387* (2013.01); *H01L 23/5389* (2013.01); *H01L 23/66* (2013.01); *H01L 24/05* (2013.01); *H01L 24/32* (2013.01); *H01L 2223/6616* (2013.01); *H01L 2223/6677* (2013.01); *H01L 2224/2919* (2013.01); *H01L 2224/32235* (2013.01); *H01L 2924/0665* (2013.01)

(58) Field of Classification Search
CPC ............. H01L 23/5388; H01L 23/5387; H01L 23/5389; H01L 23/5386; H01L 23/5384; H01L 23/49855; H01L 23/49883; H01L 23/13; H01L 23/66; H01L 24/32; H01L 24/05; H01L 2223/6616; H01L 2223/6677; H01L 2224/2919; H01L 2224/0665; H01L 2224/32235; H01H 2231/05
USPC ........ 257/679, 698, 774, 789, 532, E23.064, 257/E23.065, E23.176, E23.177, E21.499, 257/E21.567, E21.598; 174/256, 257, 174/544, 552; 235/487, 488, 492, 493; 438/108, 110, 458, 557
See application file for complete search history.

(56) References Cited

U.S. PATENT DOCUMENTS

| | | | |
|---|---|---|---|
| 6,188,580 B1 | 2/2001 | Huber et al. | |
| 6,595,426 B1 | 7/2003 | Brunet et al. | |
| 7,807,551 B2 | 10/2010 | Huang et al. | |
| 7,951,687 B2 | 5/2011 | Giesbers et al. | |
| 8,258,011 B2 | 9/2012 | Brun et al. | |
| 8,740,092 B2 * | 6/2014 | Sakai ................. | G06K 19/0727 235/487 |
| 9,209,047 B1 * | 12/2015 | Hackler, Sr. .......... | H01L 21/561 |
| 2002/0027274 A1 | 3/2002 | Usami et al. | |
| 2003/0020182 A1 * | 1/2003 | Blanc ............... | G06K 19/07743 257/789 |
| 2006/0261456 A1 * | 11/2006 | Steffen ................. | G06K 19/077 257/679 |

(Continued)

*Primary Examiner* — Dao H Nguyen
(74) *Attorney, Agent, or Firm* — Your Intellectual Property Matters, LLC; Robert A. Frohwerk

(57) ABSTRACT

The described Flexible Micro-Module (FMM) is a device that is made possible by the application of ultra-thin flexible single crystalline ICs. The FMM integrates the IC(s), insulating contact substrate, vias for connections to pads, and external contacts into a single device. The thin and flexible FMM eliminates the need for wire bonds and card body cavities in smart card assemblies, and accommodates applying larger ICs to smart cards than what is possible with conventional micro-modules.

18 Claims, 4 Drawing Sheets

(56) References Cited

U.S. PATENT DOCUMENTS

| | | | |
|---|---|---|---|
| 2008/0149731 A1 | 6/2008 | Arai et al. | |
| 2009/0250521 A1* | 10/2009 | Fujita | G06K 19/07735 |
| | | | 235/488 |
| 2009/0294528 A1 | 12/2009 | Halbur et al. | |
| 2010/0221870 A1 | 9/2010 | Maekawa et al. | |
| 2011/0266351 A1* | 11/2011 | Wagner | G06K 19/07722 |
| | | | 235/488 |
| 2013/0175075 A1* | 7/2013 | Kivikero | H01L 23/3114 |
| | | | 174/260 |
| 2014/0224882 A1* | 8/2014 | Hackler, Sr. | G06K 19/0779 |
| | | | 235/488 |

\* cited by examiner

FLEXIBLE MICRO-MODULE

FIELD OF THE INVENTION

The present invention relates generally to a micro-module, an assembly that is integrated with a card body to create a smart card. A micro-module includes one or more integrated circuit (IC) bonded to a micro-connector having external contacts on its surface. In particular, the described devices and methods pertain to ultra-thin flexible Semiconductor-on-Polymer (SoP) ICs integrated into a single device without wire bonds for use in Smart Card Contacted Micro-modules.

BACKGROUND OF THE INVENTION

A micro-module is a type of data storage and/or computing device that is commonly used for contacted smart cards. The device is a complex rigid assembly that includes one or more integrated circuit (IC), a micro-connector, wire bonding to connect the bond pads on the chip to the micro-connector and a molded body for encapsulation. A micro-connector provides the external contact pads of a smart card. Micro connectors commonly include six to eight pads formed on various materials such as, but not limited to, EGT (epoxy glass tape), Copper-clad (epoxy glass tape plus copper), or Teslin. The ICs used in conventional micro-modules are very small in die area to accommodate reliability limitations associated with the deformation of micro-connectors and card bodies that is typical during use. Rigid ICs fracture and break when bent. The larger the IC, the greater the failure rate. The small die area limits the complexity, and hence functionality, of the included ICs.

Micro-modules are typically 0.5 mm (500 um) in thickness and are individually inlayed in a cavity formed in a card body that is commonly made of PVC. Cards using micro-modules composed of today's chips require a cavity to be formed in the card body to accommodate inlaying of the micro-module. The requirement for a cavity limits the minimum card thickness and increases the cost of manufacturing due to the necessity of forming a cavity in the card.

BRIEF SUMMARY OF THE INVENTION

The Flexible Micro-Module (FMM) described here is a device that is enabled by the utilization of ultra-thin flexible integrated circuits commonly referred to as ICs, Die or Chips. Integrated circuits are fabricated in quantity from semiconductor wafers. When individual pieces of the wafer are separated each from the others, a process called singulation, the individual pieces are referred to as die or chips. Typical semiconductor wafers for ICs are 200 mm or 300 mm diameter single crystalline silicon. These wafers have a standard thickness greater than 700 microns (um). Semiconductor materials such as silicon are very rigid at 700 um thickness.

Wafers are almost always thinned prior to singulation. The common practice is to thin the wafers to 50-300 um prior to packaging or for use in bare die assembly. Silicon remains mechanically robust and rigid in this thickness range and is capable of being handled using industry standard assembly methods.

Ultra-thin die, those with thickness less than 50 um, retain rigid characteristics but crack and fragment excessively when below 50 um. When silicon achieves ultra-thin thickness less than 15 um it becomes flexible but mechanically unstable and extremely difficult to handle.

Semiconductor-on-Polymer (SoP) Integrated Circuits (ICs) are a specific type of ultra-thin flexible IC that resolves the limitations of mechanical stability by encapsulating the flexible ultra-thin semiconductor in a flexible polymer prior to singulation.

The FMM as described here integrates one or more flexible IC, an insulating contact substrate, filled-via pad connection, and external contacts into a single device that does not require wire bonds. The FMM is ultra-thin and can be surface mounted or laminated between planar card layers without the use of a cavity. This reduces the cost of the card material and simplifies card manufacturing. The FMM, including the IC, is thin, flexible and not subject to the reliability failures associated with the deformation of conventional rigid micro-module assemblies. This important feature eliminates the reliability-mandated limit on die size for reliability and enables the use of larger ICs and arrays of ICs for large scale memory and processing. The ability to utilize larger ICs allows more complex ICs such as System-On-Chip ICs, large memory ICs, ICs with sensors and ICs that support wireless communication.

BRIEF DESCRIPTION OF THE DRAWINGS

The particular features and advantages of the invention will become apparent from the following description taken in conjunction with one or more of the accompanying FIGS. 1-12 of the drawings.

Figure 1:
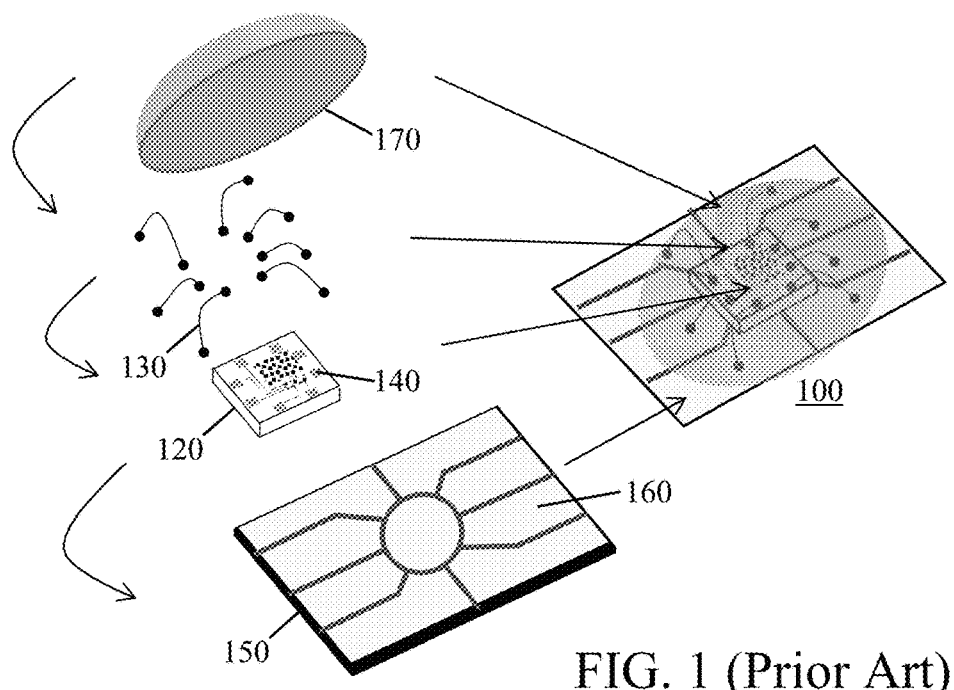
FIG. 1 illustrates an assembly of a micro-module in the prior art where arrows indicate the assembly relationship.

The following Reference Numbers may be used in conjunction with one or more of the accompanying FIGS. 1-12 of the drawings:

100 assembly for a conventional micro-module
120 rigid IC die
130 bonding wires
140 IC bond pad
150 micro-connector
160 external contact pad
170 encapsulation 180 card body
190 cavity in smart card body for reception of a conventional micro-module
200 Flexible Micro-module, FMM
220 flexible SoP ultra-thin IC die
230 surface of insulating coating
240 insulating contact substrate with surface area for external contacts
250 via
260 flexible external contact
270 dielectric film layer
280 via through dielectric film layer

DETAILED DESCRIPTION OF THE INVENTION

The Flexible Micro-Module (FMM) as described here is a device that is made possible by the application of ultra-thin flexible single crystalline ICs. The FMM integrates the IC(s), insulating contact substrate, pad connections, and external contacts into a single device that does not require wire bonds. The FMM is ultra-thin and can be surface mounted or laminated between card body layers without the need for a cavity. The FMM is so thin as to be flexible, acceptable for lamination on planar card bodies, consistent with zero-profile requirements and inclusive of ultra-thin semiconductor ICs. The elimination of wire bonds and the elimination of any requirement for a card cavity reduce the cost of a smart card and simplify card manufacturing. The FMM, with IC included, is thin, flexible and not subject to the reliability failures associated with the deformation of conventional micro-module assemblies; it accommodates a variety of bendable and conformal applications. This important feature eliminates the limit on die size for reliability, enabling the use of larger ICs. This allows for integration of System-On-Chip ICs, arrays of ICs for large scale memory and processing, including sensor, antenna and complete wireless communication function.

Figure 2A:
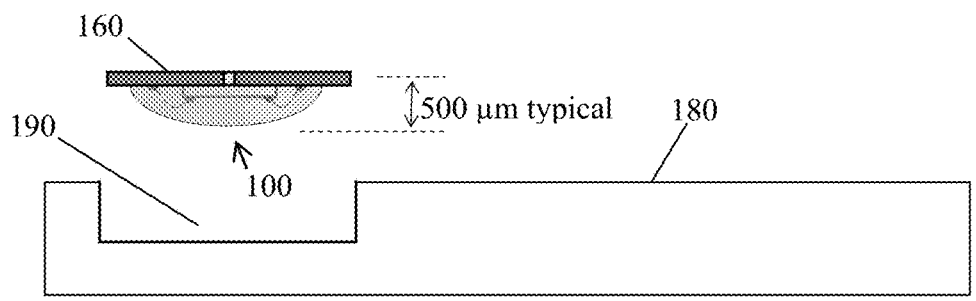
FIG. 2A is a side view showing the assembly of FIG. 1 inverted for insertion into a cavity of a card body with insertion completed in FIG. 2B.
Figure 2B:
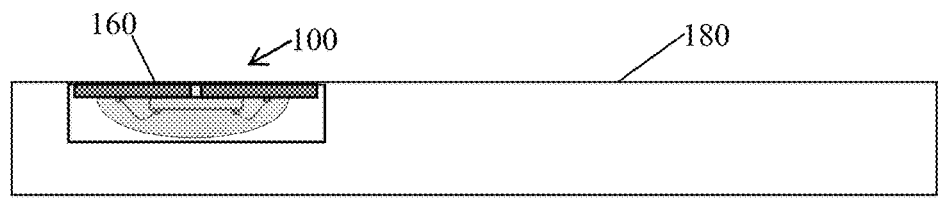
Figure 3:
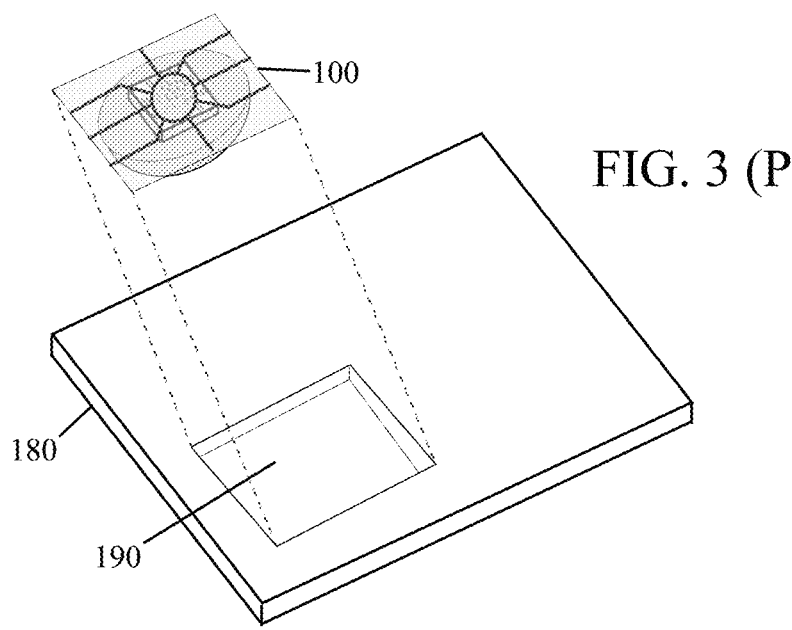
FIG. 3 depicts the placement of the rigid IC assembly of FIGS. 1-2 into a cavity to produce a conventional smart card.
Figure 4:
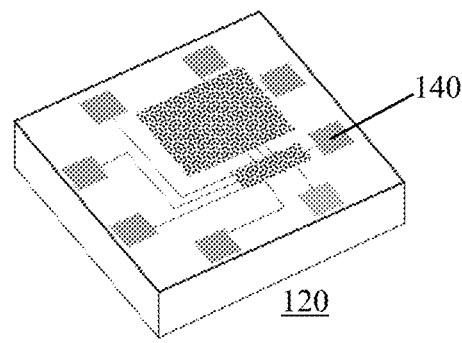
FIG. 4 shows an unmounted rigid die.

Assembly of the circuitry for a conventional micro-module is illustrated in FIG. 1 by the arrows on the left. A generic integrated circuit in the form of an unmounted rigid die 120 is attached to a micro-connector 150. Bonding wires 130 are bonded from bond pads 140 on the die to a multiplicity of contact pads 160 which will provide external connections. The addition of encapsulation 170 produces a die assembly 100 for a conventional smart card. As shown in FIG. 2 such an encapsulated assembly will typically have a height of 500 μm. An assembly such as this based on a rigid die 120 (FIG. 4) requires that the structure (card body 180 of FIG. 3) for a conventional smart card body must contain a cavity 190 to receive the die assembly. The cavity is formed into the card body by a process such as molding or milling. The card body 180 must have adequate thickness to be sufficiently rigid to support the assembled circuitry and to hold it in place without allowing it to flex to the point of fracture. This limits the size of the allowable die to be even smaller than what might have been allowed of a rigid die used in other applications. The rigid die with bond pads 140 exposed for wire bonding is shown in FIG. 4.

Figure 5:
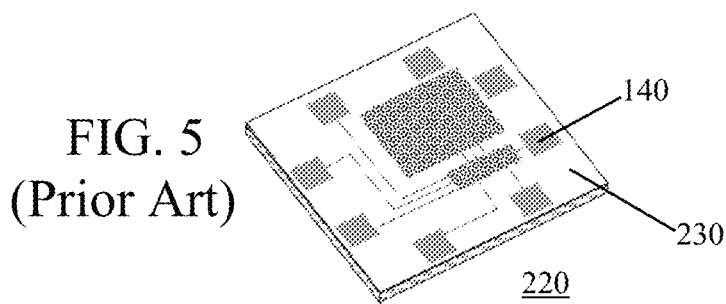
FIG. 5 depicts an unmounted ultra-thin flexible Semiconductor-on-Polymer (SoP) die with an insulated coating.

A die produced by a process such as Semiconductor-on-Polymer (SoP), as described in U.S. Pat. No. 9,082,881, is shown in FIG. 5. In comparison with the rigid die 120 of FIG. 4, this ultra-thin die 220 is sufficiently flexible to accommodate the new FMM assembly described here. The bond pads on SoP ICs may be covered with polymer and protected when not used. Semiconductor-on-Polymer is a specific technology that converts single crystalline semiconductor wafers into polymerized ultra-thin physically flexible die. The silicon semiconductor version of the technology also referred to as SoP, uses conventional silicon substrates such as those common for CMOS. The semiconductor layer included in SoP technology is reduced to an ultra-thin semiconductor layer typically less than 15 um thick. The surfaces of the ultra-thin semiconductor die are polymerized on all sides to restore mechanical integrity to enable handling prior to and during assembly onto a card or similar substrate. These high performance single crystalline devices must not be confused with lower performing thin-film transistor devices such as TFT or plastic ICs.

Figure 6:
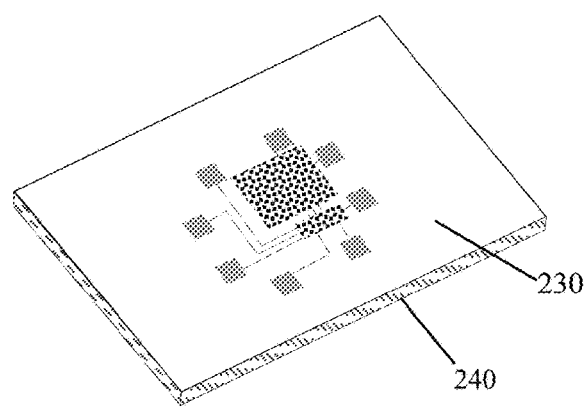
FIG. 6 illustrates the area of a flexible SoP die with the addition of an extended insulating coating forming an insulating contact substrate with sufficient area to accommodate exterior contacts.

A modification of a SoP IC that can be applied to an FMM is shown in FIG. 6. The SoP polymerization area is augmented by extension to create an insulating contact substrate 240 without any increase in thickness. The inherent polymerized layers can provide the flexible die with sufficient surrounding surface area (230) upon which large flexible external contacts 260 can be formed.

Figure 7:
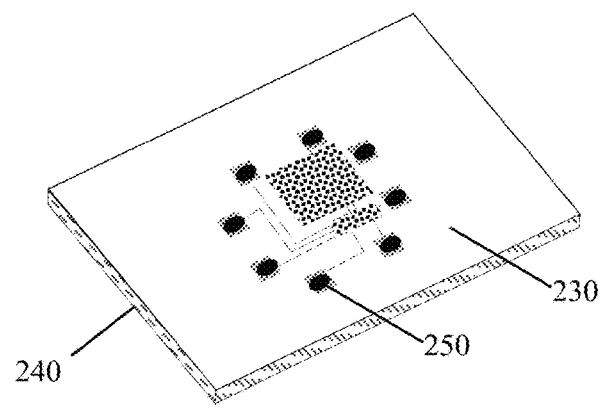
FIG. 7 depicts the SoP die of FIG. 6 with vias that have been opened in the insulating coating to provide external access to the IC bond pads.
Figure 8:
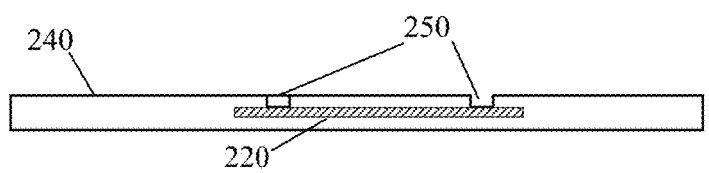
FIG. 8 is a side view of a FMM with open vias prior to forming external contacts.
Figure 9:
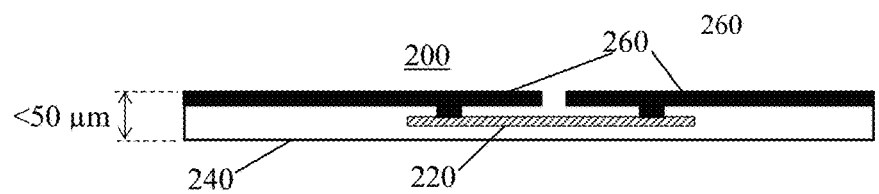
FIG. 9 is a side view of a FMM with vias filled to form flexible external contacts.
Figure 10:
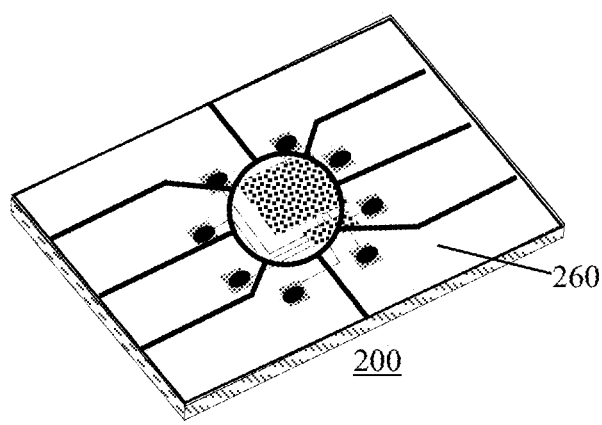
FIG. 10 shows a fully assembled FMM with flexible external contacts.
Figure 11:
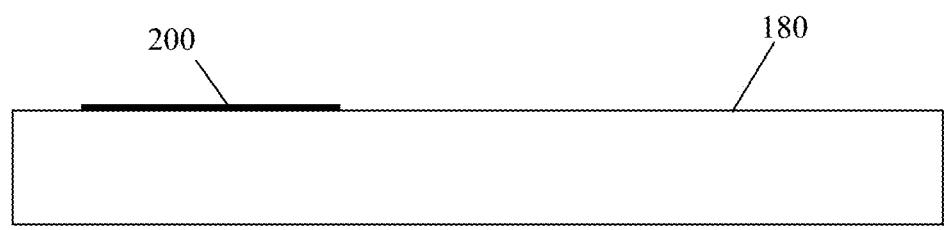
FIG. 11 depicts a fully assembled FMM attached directly to a planar card body.

As shown in FIG. 7 vias 250 are opened over the topside pads in the surface of the insulating coating 230 to provide the access necessary to make electrical connection to the IC bond pads. These via openings, shown in cross-section in FIG. 8, are well suited for use in micro-modules. In addition to its flexibility, another characteristic of the SoP micro-module is that it allows for flexible external contacts 260 or other conductive patterns to be printed directly onto its surface as shown in FIG. 9.

Contact to the bond pads of the FMM can be made by filling the vias with conductive polymers or similar flexible conductive materials. This eliminates the use of bond wires. An exterior contact layer may be written directly onto the top insulator of the SoP using flow-to-fill vias with no additional processing required. Uses of materials such as conductive epoxy provide low-cost connections and external contacts. Any external contact material may be used that naturally attaches to the bond pad when filling the vias.

Use of a FMM enables a flexible smart card to be produced entirely without the need for molding of micro-module encapsulation or milling steps to produce a card cavity. The FMM can be attached directly to a planar card using an adhesive, epoxy or similar bonding material. The card body for the FMM is not limited by the need for a cavity and can be much thinner than those for conventional smart-cards. Such a flexible smart card based upon a FMM easily accommodates larger die than its rigid predecessors which provides an additional benefit of higher reliability.

The profile of the FMM, being less than 50 μm, enables construction of card assemblies without the use of a cavity, as well as allowing for the FMM to be laminated between planar card layers or to be surface mounted. The necessity of fabricating a cavity 190 is a significant portion of the cost of smart card assembly that is eliminated using FMM. The resulting flexibility makes it feasible to use large die on a card without negatively impacting reliability due to deformation, or to provide conductive interconnections between multiple die, such as VLSI (Very Large-Scale Integrated) logic and memory circuitry.

Figure 12:
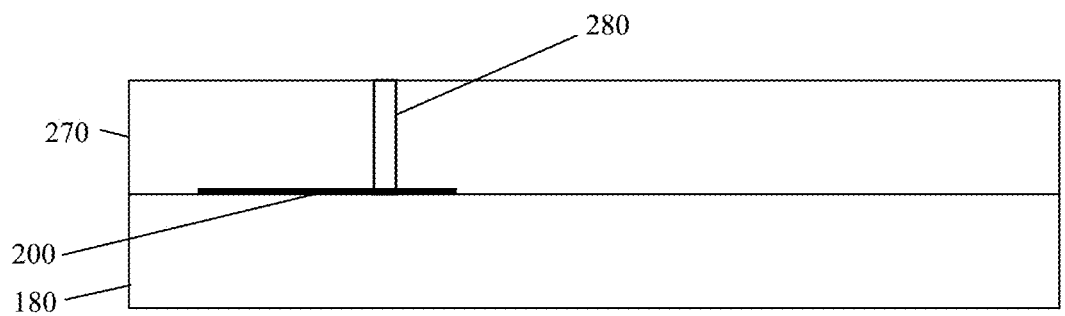
FIG. 12 depicts a fully assembled FMM attached directly to a planar card body covered with a dielectric film layer having a via to provide a flexible external contact.

One form of the devices described here may include a dielectric film layer 270 on top of the insulating contact substrate as shown in FIG. 12. A via 280 that extends through the dielectric film layer can be included to provide external contact capability. The dielectric film layer may include printed conductive materials on either top or bottom of the film. PET (polyethylene terephthalate), PI (polyimide), PC (polycarbonate), PVC (polyvinyl chloride) and paper are some of many possible such dielectric film layers that allow the FMM to contact printed conductive materials on either surface of the dielectric film.

For a contacted smart card it is possible to use printed exterior contacts over the top insulating coating or dielectric film layer to accommodate a standard reader format with the exterior contacts being configurable as needed to support a variety of card reader types. Another option allows the exterior contacts to be attached to external circuits such as those needed to provide signals to support continuity, capacitive or similar sensor function capability integrated in the IC. The filling of the vias with conductive materials for exterior contacts seals the via openings for environmental protection. When desired, transparent material may be used for aesthetic purposes or to provide an optical interface.

Assemblies using the described FMM simultaneously offer the advantages of reduced cost and increased reliability. These are obtained by: reduction of module complexity; reduction in the number of assembly steps; elimination of wire bonding; elimination of a micro-connector and elimination of a card cavity. The FMM is compatible with roll-to-roll assembly methods, or FMM devices may be manufactured in wafer form and then singulated into individual devices.

In addition to smart cards, techniques described here offer a viable alternative to bar codes and magnetic strips. The techniques are also applicable to any flexible label, paper, printable media or packaging material that can benefit from transmission and reception of data by direct electrical contact.

Though the above process has been described using flexible ICs and flexible substrates, there is nothing described here that precludes application of the described FMM to a rigid card body. The application of FMM on rigid materials can result in achieving zero-profile form factors that are not possible with conventional micro-modules.

It will be recognized by those skilled in these arts that many variations of the described embodiments are possible. Although Semiconductor-on-Polymer (SoP) has been described here as a means of acquiring flexible ultra-thin single crystalline semiconductor ICs, other means of producing the ICs would be useful. Though silicon is the most likely semiconductor substrate for flexible ICs, other single crystalline wafer materials are also feasible candidates for the IC substrate. The card body may be selected from a variety of thin and flexible materials, not to be limited by the few described here. The benefits of the described micro-module are derived from its thinness, flexibility and filled-via pad connections which enable low-cost smart card production, durability and reliability.

What is claimed is:

1. A flexible micro-module, comprising:
   an insulating contact substrate having a first flexible IC (Integrated Circuit) die,
   wherein the first flexible IC die includes
   a first flexible single crystalline IC die;
   an insulating coating;
   a bond pad; and
   at least one via extending through the insulating coating,
   wherein the at least one via is filled with a conductive polymer, and
   wherein the at least one via allows direct electrical contact to a flexible external contact.

2. The flexible micro-module of claim 1, wherein the flexible single crystalline IC die is a polymerized SoP (Semiconductor-on-Polymer) IC.

3. The flexible micro-module of claim 1, wherein the conductive polymer is a polyimide coating.

4. The flexible micro-module of claim 1, wherein the flexible external contact comprises a material that naturally attaches to other contact pads.

5. The flexible micro-module of claim 1, wherein the first flexible IC is a System-on-Chip.

6. The flexible micro-module of claim 5, wherein the first flexible IC comprises a sensor function.

7. The flexible micro-module of claim 5, wherein the first flexible IC comprises a wireless communication function.

8. The flexible micro-module of claim 1, wherein the first flexible IC die is mounted on a card body using an adhesive.

9. The flexible micro-module of claim 8, wherein the adhesive is an epoxy.

10. The flexible micro-module of claim 8, wherein the card body is selected from a flexible label, polymer, paper, printable media and packaging material.

11. The flexible micro-module of claim 8, wherein the card body is rigid.

12. The flexible micro-module of claim 8, wherein the conductive polymer with which the via is filled comprises a transparent material to provide an optical interface.

13. The flexible micro-module of claim 8, further comprising an antenna, wherein a via connects to the antenna.

14. The flexible micro-module of claim 8, further comprising:
   a second flexible IC die, which is a second flexible single crystalline IC die; and
   one or more conductive interconnections between the first flexible single crystalline IC die and the second flexible single crystalline IC die.

15. The flexible micro-module of claim 8, further comprising a first card body layer and a second card layer between which the flexible micro-module is laminated.

16. The flexible micro-module of claim 15 wherein at least one via extends through the second card layer.

17. The flexible micro-module of claim 16, wherein the via through the second card layer is filled with a flexible conductive material.

18. The flexible micro-module of claim 16, wherein a surface of the second card layer includes a conductive pattern.

* * * * *